United States Patent
Choi et al.

(10) Patent No.: US 9,306,099 B2
(45) Date of Patent: Apr. 5, 2016

(54) MATERIAL INCLUDING GRAPHENE AND AN INORGANIC MATERIAL AND METHOD OF MANUFACTURING THE MATERIAL

(75) Inventors: Jae-young Choi, Suwon-si (KR); Won-mook Choi, Hwaseong-si (KR); Duk-hyun Choi, Hwaseong-si (KR); Sang-woo Kim, Gumi-si (KR); Kyung-sik Shin, Daejeon (KR)

(73) Assignees: SAMSUNG ELECTRONICS CO., LTD. (KR); KUMOH NATIONAL INSTITUTE OF TECHNOLOGY INDUSTRY-ACADEMIC COOPERATION FOUNDATION (KR)

( * ) Notice: Subject to any disclaimer, the term of this patent is extended or adjusted under 35 U.S.C. 154(b) by 916 days.

(21) Appl. No.: 12/956,964

(22) Filed: Nov. 30, 2010

(65) Prior Publication Data

US 2011/0129675 A1    Jun. 2, 2011

(30) Foreign Application Priority Data

Dec. 1, 2009   (KR) .................. 10-2009-0117834
Nov. 30, 2010   (KR) .................. 10-2010-0120515

(51) Int. Cl.
| | | |
|---|---|---|
| B32B 9/00 | (2006.01) | |
| H01L 31/0352 | (2006.01) | |
| C01B 31/04 | (2006.01) | |
| H01L 31/036 | (2006.01) | |
| H01L 31/0392 | (2006.01) | |

(52) U.S. Cl.
CPC .... *H01L 31/035227* (2013.01); *C01B 31/0438* (2013.01); *H01L 31/036* (2013.01); *H01L 31/0392* (2013.01); *C01B 2204/00* (2013.01); *Y02E 10/50* (2013.01); *Y10T 428/30* (2015.01)

(58) Field of Classification Search
CPC .................. C01B 31/0438; C01B 2204/00
USPC .............. 257/29; 438/478; 428/408; 423/448
See application file for complete search history.

(56) References Cited

U.S. PATENT DOCUMENTS

| | | | |
|---|---|---|---|
| 2007/0077670 A1 | | 4/2007 | Kim et al. |
| 2007/0187694 A1 | * | 8/2007 | Pfeiffer ........................ 257/76 |
| 2008/0261116 A1 | | 10/2008 | Burton et al. |
| 2009/0110627 A1 | | 4/2009 | Choi et al. |
| 2009/0169828 A1 | | 7/2009 | Hersee et al. |
| 2009/0200707 A1 | * | 8/2009 | Kivioja et al. ............... 264/293 |
| 2009/0235862 A1 | * | 9/2009 | Cha et al. ....................... 117/94 |
| 2009/0294759 A1 | * | 12/2009 | Woo et al. ...................... 257/29 |
| 2011/0030991 A1 | * | 2/2011 | Veerasamy .............. 174/126.1 |

FOREIGN PATENT DOCUMENTS

| | | |
|---|---|---|
| KR | 1020080100430 A | 2/2008 |
| KR | 1020090017454 A | 2/2009 |
| KR | 1020090043418 A | 5/2009 |
| WO | 2009/120151 A1 | 10/2009 |

\* cited by examiner

*Primary Examiner* — Daniel H Miller
(74) *Attorney, Agent, or Firm* — Cantor Colburn LLP

(57) ABSTRACT

A material including: graphene; and an inorganic material having a crystal system, wherein a crystal plane of the inorganic material is oriented parallel to the (0001) plane of the graphene. The crystal plane of the inorganic material has an atomic arrangement of a hexagon, a tetragon, or a pentagon.

14 Claims, 9 Drawing Sheets

MATERIAL INCLUDING GRAPHENE AND AN INORGANIC MATERIAL AND METHOD OF MANUFACTURING THE MATERIAL

CROSS-REFERENCE TO RELATED APPLICATIONS

This application claims the benefit of Korean Patent Application No. 10-2009-0117834, filed on Dec. 1, 2009, and 10-2010-0120515, filed on Nov. 30, 2010, and all the benefits accruing therefrom under 35 U.S.C. §119, the content of which in its entirety is herein incorporated by reference.

BACKGROUND

1. Field

This disclosure relates to a material including graphene and an inorganic material and a method of manufacturing the material, and in particular, to a material having improved electrical characteristics.

2. Description of the Related Art

Generally, graphite has a structure in which two-dimensional ("2D") graphene sheets are stacked parallel to each other to form a three-dimensional crystalline material. The graphene sheets have a planar shape in which carbon atoms are connected to each other in a hexagonal configuration. Recently, the characteristics of a single sheet of graphene or a few sheets of graphene, which were peeled off of graphite, were evaluated in several studies. The evaluations found that the characteristics of graphene are very different from the characteristics of conventional materials.

For example, the electrical characteristics of graphene are anisotropic, and thus depend on the crystallographic orientation of the graphene. The anisotropy enables selection of the electric characteristics by using graphene in a selected direction, and thus the selected electrical characteristics may be utilized in a carbonaceous electrical device or in a carbonaceous electromagnetic device.

However, when a device is manufactured by depositing a material on graphene, the structure of the interface between graphene and the deposited material greatly affects the characteristics of the manufactured device. In addition, when an electrical charge flows between graphene and the deposited material, a defect at the interface between the graphene and the deposited material may result in interfacial resistance between graphene and the deposited material. Thus, in order to effectively use the excellent electrical conductivity of graphene, materials in which interfacial defects are minimized are needed.

SUMMARY

Provided is a material of graphene and an inorganic material which is manufactured at low cost and of which an interface has reduced defects and electrical resistance.

Provided is a method of manufacturing the material.

Provided is an electrical device including the material.

Additional aspects, features, and advantages will be set forth in part in the description which follows and, in part, will be apparent from the description.

According to an aspect, a material includes: graphene; and an inorganic material having a crystal system, wherein at least one crystal plane of the inorganic material is oriented parallel to the (0001) plane of the graphene.

The material may further include a substrate on the graphene.

The crystal plane of the inorganic material may have an atomic arrangement of a hexagon, a tetragon, or a pentagon.

The crystal system of the inorganic material is a cubic system, a tetragonal system, a hexagonal system, an orthorhomic system, a rhomoboheral system, a monoclinic system, or a triclinic system.

The inorganic material may include at least one of Ge, Si, Sn, SiC, AlAs, AlP, AlSb, $Al_2O_3$, BN, BP, GaAs, GaN, GaP, GaSb, GaNO, InN, InNO, InAs, InP, InSb, CdS, CdSe, CdTe, ZnO, ZnS, ZnSe, ZnTe, PbS, PbTe, AlN, BNO, MgS, MgSe, or MgTe.

The inorganic material may include at least one of ZnO, GaN, $Al_2O_3$, or a combination thereof.

A distance between atoms at first and third sites in the hexagon atomic arrangement of the inorganic material may be about −20 percent to about 20 percent of a distance between carbon atoms at first and fourth sites of a hexagonal repeating unit of the graphene.

A shorter axis of the hexagon atomic arrangement of the inorganic material and a longer axis of the graphene may be oriented in a substantially same direction.

The inorganic material may be an epitaxial layer on the graphene.

The graphene may have a sheet shape and an area of equal to or greater than about 1 square millimeter.

Also disclosed is an electrical device including the foregoing material.

According to an aspect, a material includes: a substrate having a surface; an inorganic material having a crystal system, wherein at least one crystal plane of the inorganic material is oriented to be parallel to the surface of the substrate; and graphene interposed between the surface of the substrate and the inorganic material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
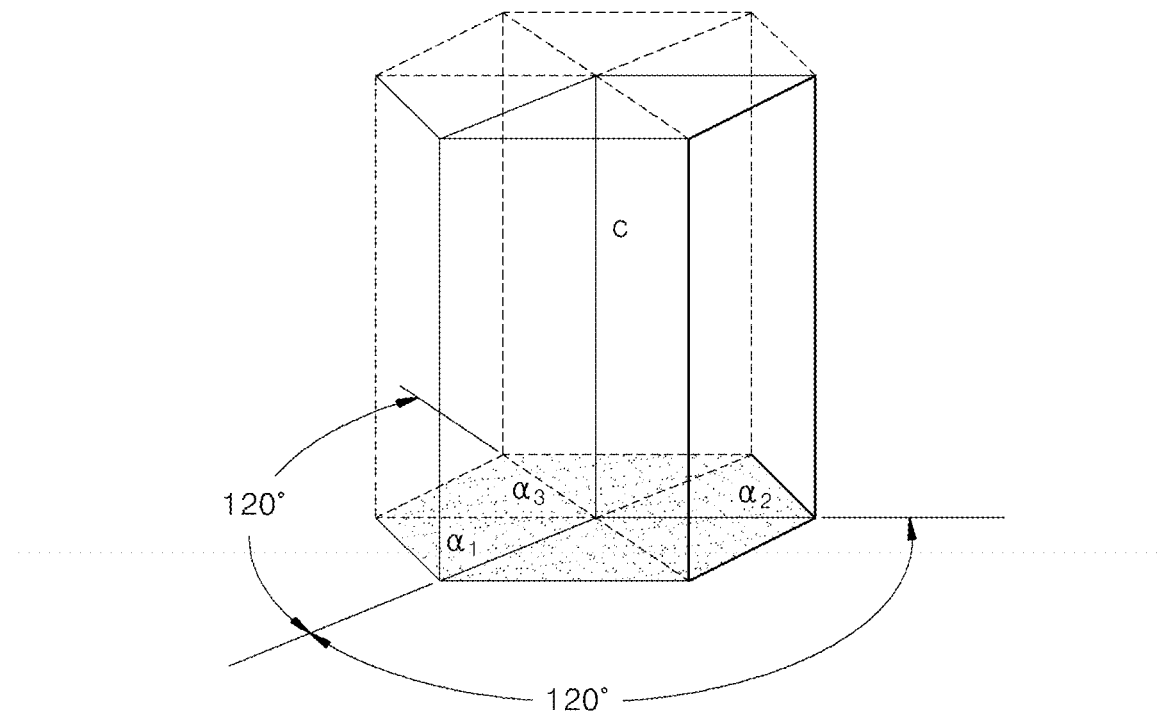
FIG. 1 is a schematic view illustrating a hexagonal unit cell.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Herein, crystal planes of materials are identified by their Miller indices unless otherwise indicated.

In a material comprising graphene and an inorganic material, a crystal plane of an inorganic material having a crystal structure is oriented to be substantially parallel to the (0001) plane of graphene.

The term "graphene" as used in the present specification means a polycyclic aromatic molecule formed from a plurality of carbon atoms which are covalently bound to each other. The covalently bound carbon atoms may form a six-membered ring as a repeating unit, and may further include at least one of a five-membered ring and a seven-membered ring. Accordingly, graphene comprises a single layer of covalently bonded carbon atoms having sp$^2$ hybridization. A plurality of graphene layers is often referred to in the art as graphite. However, for convenience, "graphene" as used herein may be a single layer, or also may comprise a plurality of layers of carbon. Thus graphene, as used herein, may have a multiply layered structure formed by stacking single layers of graphene. The maximum thickness of the graphene may be about 100 nanometers (nm), specifically 90 nm, more specifically 80 nm.

The repeating unit of graphene is a six-membered ring containing six carbon atoms, and a plurality of the six-membered rings are connected to each other to provide a planar structure. When multiple layers are present, the layers are stacked on each other. Because the six-membered ring structure is similar to a hexagonal prism structure, a plane index and a direction index of the hexagonal prism structure may also be applied to the six-membered graphene ring structure. As illustrated in FIG. 1, a unit cell of the hexagonal prism lattice has $a_1$, $a_2$, and $a_3$ axes, which are at an angle of 120° relative to each other and on a same plane, and a c axis that is perpendicular to the plane of the $a_1$, $a_2$, and $a_3$ axes. Thus, each plane index (i.e., Miller-Bravais index) and direction index of the hexagonal prism structure has four indices that correspond to the four axes. For example, a reference plane of a six-membered ring of graphene that has a 2-dimensional structure may be the plane of the axes $a_1$, $a_2$, and $a_3$ that is shadowed in FIG. 1 and the plane may have an index of (0001). A surface of a material may correspond to a plane having a particular plane index. Thus, for example, a (001) plane of a material is understood to refer to a surface corresponding to a (001) plane.

The inorganic material, which may be for example, a metal or a metal oxide, may have a various crystal system such as a cubic system, a tetragonal system, a hexagonal system, an orthorhomic system, a rhomboheral system, a monoclinic system, or a triclinic system. The crystal system may comprise crystal planes characterized by their Miller indices.

The crystal planes of the inorganic material may have a various atomic arrangement such as a hexagon, a tetragon, or a pentagon as a unit cell.

In an embodiment, the at least one crystal plane of the inorganic material having the various crystal system can be oriented parallel to the (0001) plane of graphene, and thus the selected layer of the inorganic material may be oriented substantially parallel to the (0001) plane of graphene.

Figure 2A:
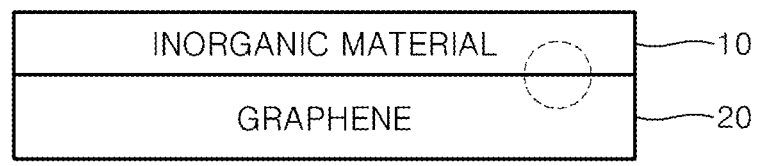
FIG. 2A is a schematic view illustrating an embodiment of an interface of graphene and an inorganic material.
Figure 2B:
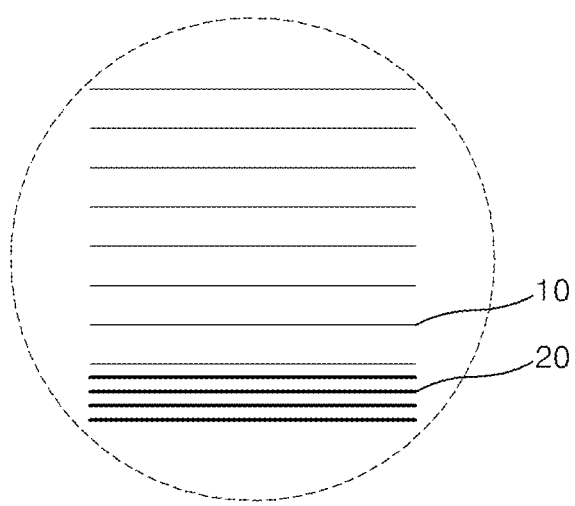
FIG. 2B is an enlarged view of the indicated region of FIG. 2A.
Figure 2C:
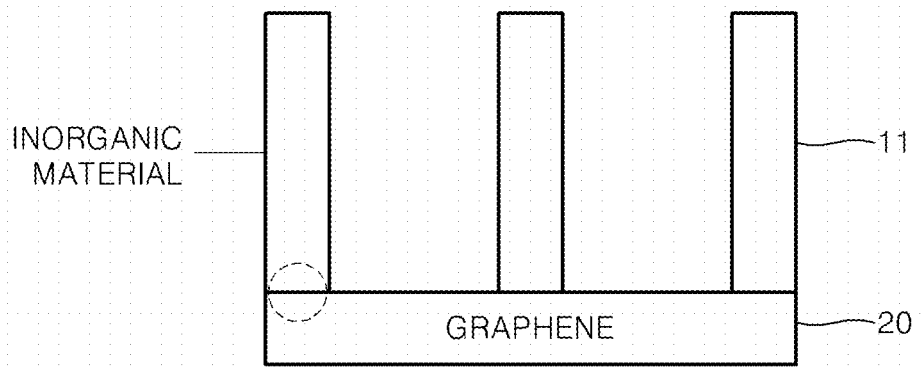
FIG. 2C is a schematic view illustrating an embodiment of an interface of graphene and an inorganic material.
Figure 2D:
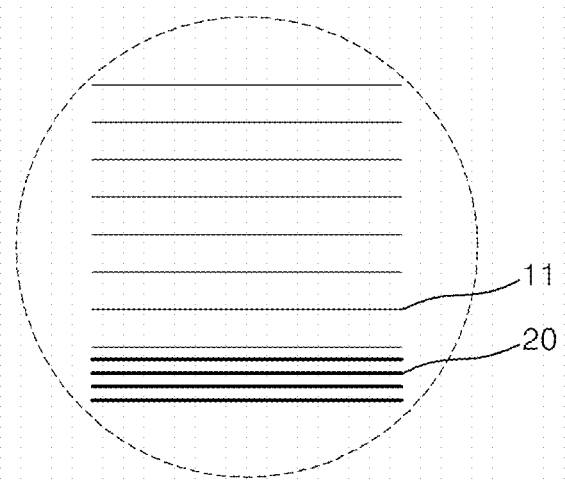
FIG. 2D is an enlarged view of the indicated region of FIG. 2C.

Examples of the material described above are illustrated in FIGS. 2A to 2D. FIGS. 2A and 2B illustrate an exemplary embodiment of an inorganic material 10 layer disposed (e.g., formed) on graphene 20. In an embodiment, the inorganic layer may be an epitaxial layer on the graphene. Referring to FIGS. 2A and 2B, an inorganic material may be formed such that at least one crystal plane of the inorganic material is parallel to and in direct contact with the (0001) plane of the graphene. FIGS. 2C and 2D illustrate an example of an inorganic material rod 11 disposed (e.g., formed) on graphene 21. In an embodiment, the graphene may be epitaxial, thus the crystal structure of the inorganic material rod and the graphene may have a substantially same orientation. Referring to FIGS. 2C and 2D, an inorganic material may be disposed (e.g., grown) such that a crystal plane of the inorganic material is oriented parallel to and directly on the (0001) plane of the graphene, for example.

In order to orient the inorganic material so that a selected plane is parallel to the (0001) plane of the graphene, the crystal structure of the inorganic material desirably also may have an atomic arrangement of a hexagon, a tetragon, or a pentagon as a unit cell.

An exemplary inorganic material includes Ge, Si, Sn, SiC, AlAs, AlP, AlSb, $Al_2O_3$, BN, BP, GaAs, GaN, GaP, GaSb, GaNO, InN, InNO, InAs, InP, InSb, CdS, CdSe, CdTe, ZnO, ZnS, ZnSe, ZnTe, PbS, PbTe, AlN, BNO, MgS, MgSe, MgTe, or a combination thereof.

As is further disclosed above, the selected plane of the inorganic material is oriented to be parallel to the selected surface of the graphene, and in this orientation, the inorganic material may be formed as, for example, an epitaxial structure. In an embodiment, the c axis of the graphene may be substantially perpendicular to the selected surface of the inorganic material.

Figure 3A:
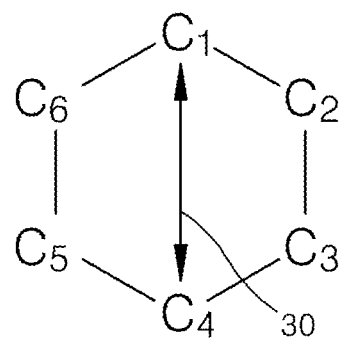
FIGS. 3A and 3B are schematic views illustrating distances in a hexagonal repeating unit of graphene and in a hexagonal repeating unit of an inorganic material, respectively.
Figure 3B:
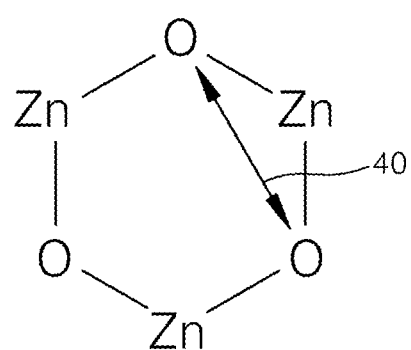

When the inorganic material has a hexagon atomic arrangement as a unit cell in one crystal plane, a longer axis 30 of graphene and a shorter axis 40 of the inorganic material are defined as illustrated in FIGS. 3A and 3B, respectively, for an embodiment wherein the inorganic material is ZnO, for example, although the inorganic material is not limited thereto. FIG. 3A illustrates a repeating unit of graphene having a six-membered ring structure, wherein an axis between a carbon atom at a first site C1 and a carbon atom at a fourth site C4 is defined as a longer axis of graphene, which may be about 2.852 Å. A distance between atoms at the first and third sites of a six-membered ring structure of the inorganic material is defined as a shorter axis. For example, FIG. 3B illustrates the crystal structure of a repeating unit of ZnO, wherein a length between oxygen atoms at first and third sites is the shorter axis, and may be about 3.261 Å. In the disclosed epitaxial structure, the longer axis of graphene and the shorter axis of the inorganic material are substantially aligned. Also, in an embodiment in which the inorganic material is ZnO, the difference in length between the longer axis of graphene and the shorter axis of the inorganic material (ZnO) is about 0.409 Å, which is about 14.3 percent (%) of the length of the longer axis of graphene. Thus the length of the longer axis of graphene and length of the shorter axis of the inorganic material are similar to each other. However, a distance between adjacent carbon atoms in graphene is about 1.425 Å and a distance between adjacent Zn and O atoms in ZnO is about 1.995 Å, and thus the difference in distance is about 0.570 Å, which is about 40.0% of the length of longer axis of graphene.

Thus, when the inorganic material is disposed (e.g., formed) on the graphene, the inorganic material and the graphene are oriented such that the shorter axis of the inorganic material is substantially aligned with the longer axis of the graphene, and thus the inorganic material may be disposed to have a planar structure which is substantially parallel to the graphene, which has a substantially 2-dimensional structure.

The difference between a length of the longer axis of graphene and a length of the shorter axis of the inorganic material having a hexagon atomic arrangement as a unit cell may be about −20% to about 20% of the length of the longer axis of graphene, specifically about −15% to about 15%, more specifically about −10% to about 10%. Within this range, the inorganic material and the graphene are oriented such that the shorter axis of the inorganic material is substantially aligned with the longer axis of the graphene.

Figure 4:
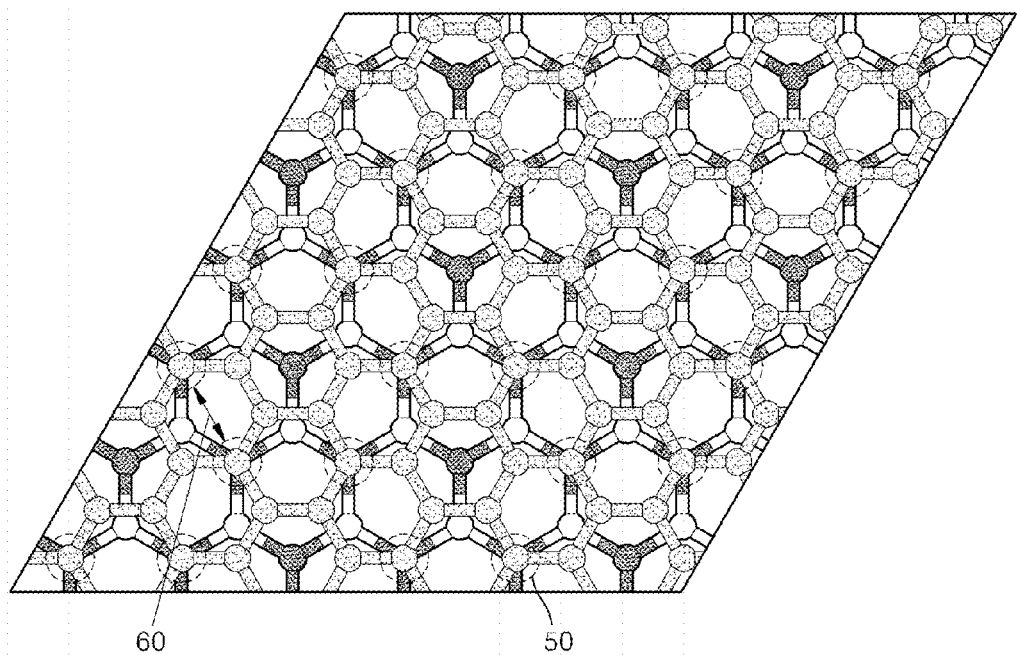
FIG. 4 is a schematic view illustrating the structure of an embodiment of a material comprising graphene and an inorganic material.

An exemplary embodiment of the structure disclosed above is illustrated in FIG. 4. Referring to FIG. 4, dashed circles 50 represent points where the C1 and C4 atoms of the graphene and the atoms at the first and third sites in the inorganic material correspond. Thus atoms at the first and third sites in the inorganic material may correspond to the oxygen atoms in ZnO, for example. Therefore the longer axis of the graphene may substantially correspond to the shorter axis of the inorganic material, as indicated by a corresponding axis 60. Accordingly, when the graphene and the inorganic material are disposed to have the foregoing configuration, the inorganic material may have a selected plane oriented parallel to a selected surface of the graphene. Also, as illustrated in FIG. 4, all of the longer axes of graphene may not correspond to all of the shorter axes of the inorganic material. In addition, all of the shorter axes of the inorganic material may not correspond all of the longer axes of the graphene. Thus only a portion of the longer axes of the graphene may correspond to a portion of the shorter axes of the inorganic material.

While not wanting to be bound by theory, it is understood that due to the parallel structure of the graphene and the inorganic material in the disclosed material, the graphene and the inorganic material have a substantially constant orientation and thus a quantity of defects that may occur at the interface between the graphene and the inorganic material may be minimized. As a result of the above parallel structure, when a material of the inorganic material and the graphene is formed, a possibility that these are grown in a vertical direction or a diagonal direction can be reduced, and structural defects at the interface of the graphene and the inorganic material may be substantially eliminated or effectively reduced.

In the structure, the inorganic material may be disposed in a one-atom-thick planar sheet or may be disposed to have a thickness of about 10 centimeters (cm). Thus the inorganic material may have a thickness of about 1 nm to about 10 cm, specifically 100 nm to about 1 cm, more specifically 1 micrometer to about 0.1 cm. The inorganic material may be disposed in the form of a rod, a wire, a thin film, or a bulk structure. For example, the inorganic material may be disposed in the form of a nanorod, a nanowire, a nanofilm, a thin film, or a bulk material, or a combination comprising at least one of the foregoing.

Because defects at the interface of the graphene and the inorganic material are reduced, as further disclosed above, an electric charge (e.g., an electric charge carrier such as an electron or a hole), may more efficiently flow across the interface, and accordingly, an interfacial resistance may be reduced. The reduced interfacial resistance may lead to improved efficiency of an electrical device including the material, which comprises graphene and the inorganic material. Exemplary electrical devices include, for example, a light emitting diode ("LED"), a solar cell, a power generating device, or a nanoscale power generator, such as a piezoelectric sensor or a piezoelectric generator, for example.

The material may be disposed (e.g., formed) on various substrates. For example, the material may be disposed on a substrate comprising a metal, a metalloid, or an insulator, or a combination comprising at least one of the foregoing. The substrate may comprise an inorganic material such as silicon (Si), a glass, GaN, a silica, indium tin oxide ("ITO"), or a combination thereof (e.g. a silicon layer/silica layered substrate). The substrate may comprise an organic material such as a plastic. The metal may include nickel, copper, tungsten, or a combination comprising at least one of the foregoing.

A method of manufacturing the material comprising graphene and the inorganic material will be further disclosed in detail.

First, graphene may be prepared according to a method which may be determined by one of skill in the art without undue experimentation. In an embodiment, for example, the graphene may be prepared by a method disclosed in Korean Patent Publication No. 2009-0043418, the content of which in its entirety is herein incorporated by reference. For example, a Ni foil having the dimensions of about 1.2 centimeters (cm) by about 1.5 cm by about 0.5 millimeter (mm) may be disposed (e.g., deposited) in a chamber, and the Ni foil heat-treated at about 1000° C. for about 5 minutes using a halogen lamp while acetylene gas is added to the chamber at a constant rate of about 200 standard cubic centimeters per minute (sccm) to form graphene. Then, a 10 layered graphene sheet having the dimensions of about 1.2 cm by about 1.5 cm may be provided by removing the heat source and naturally cooling the interior of the chamber to grow graphene in a uniform arrangement. Then, the substrate including the graphene sheet may be immersed in about 0.1 M HCl for about 24 hours to remove the Ni foil. The graphene sheet may separate from the Ni foil during the immersion.

The graphene may have a surface having an area of equal to or greater than about 1 square millimeter ($mm^2$), for example, an area of about 1 $mm^2$ to about 100 $m^2$, specifically about 1 $mm^2$ to about 25 $m^2$, more specifically about 5 $mm^2$ to about 1 $m^2$. In addition, the graphene may occupy equal to or greater than about 99% of a selected unit area, specifically about 99% to about 99.999% of a selected unit area, more specifically about 99.9% to about 99.99% of a selected unit area. When graphene occupies about 99% of a selected unit area, the graphene may be uniform, and thus, uniform electrical characteristics may be obtained. The graphene may have a purity of about 99% to about 99.9999%, specifically about 99.9% to about 99.999%, more specifically about 99.99%.

A layer of the inorganic material is disposed (e.g., formed) on the graphene by contacting the graphene with a solution comprising the inorganic material. The contacting may be performed by immersing, dipping, coating, or spraying. In an embodiment the layer of the inorganic material is formed from the solution in such a way that a (0001) plane of the inorganic material is oriented parallel to a (0001) plane of the graphene.

The solution comprising the inorganic material may comprise a solvent. The solvent may be any solvent that disperses or dissolves the inorganic material. Examples of the solvent may include ethanol, methanol, acetone, water, or a combination comprising at least one of the foregoing, and a concentration of the solvent may be about 0.001 molar (M) to about 1.0 M, specifically about 0.005 M to about 0.5 M, more specifically about 0.01 M to about 0.1 M.

The graphene may be contacted with the solution comprising the inorganic material at a temperature of about 50 to about 100° C., specifically 60 to about 90° C., more specifically about 70 to about 80° C. for about 10 minutes to about 4 hours, specifically about 20 minutes to about 2 hours, more specifically about 40 minutes to about 1 hour.

According to another embodiment, the graphene may be formed on a substrate to form a graphene coated substrate. The substrate may be any of the various substrates disclosed above. The inorganic material may then be disposed on the graphene coated substrate.

One or more embodiments will be disclosed in further detail with reference to the following examples. These examples are for illustrative purposes only and are not intended to limit the scope of the disclosed embodiments.

Example 1

Zinc acetate powder having the formula $(C_2H_3O_2)_2Zn$ was dissolved in ethanol to prepare a 0.01 M solution. Then, the prepared 0.01 M solution was spin-coated or dip-coated on a graphene coated polyethylene terephthalate ("PET") plastic substrate having the dimensions 2 cm×2 cm, thereby forming a ZnO seed layer. The plastic substrate coated with graphene, on which the ZnO seed layer was formed, was immersed in a solution for growing ZnO in order to grow a ZnO nanorod. The ZnO growth solution was prepared by dissolving zinc nitrate having the formula $Zn(NO_3)_2.6H_2O$ and hexamethylenetetramine ("HMT") having the formula $C_6H_{12}N_4$ in 250 milliliters (ml) of deionized ("DI") water. The prepared ZnO growth solution had a concentration of 0.025 M Zn nitrate, 0.025 M HMT and DI Water. The plastic substrate, having the ZnO seed layer, was immersed in each of the prepared ZnO growth solutions and then the temperature was increased to 95° C. and held for 3 hours, thereby synthesizing the ZnO nanorod on the graphene coated plastic substrate. The formed ZnO nanorod had a length of about 2000 nm and a diameter of about 100 nm.

Figure 5:
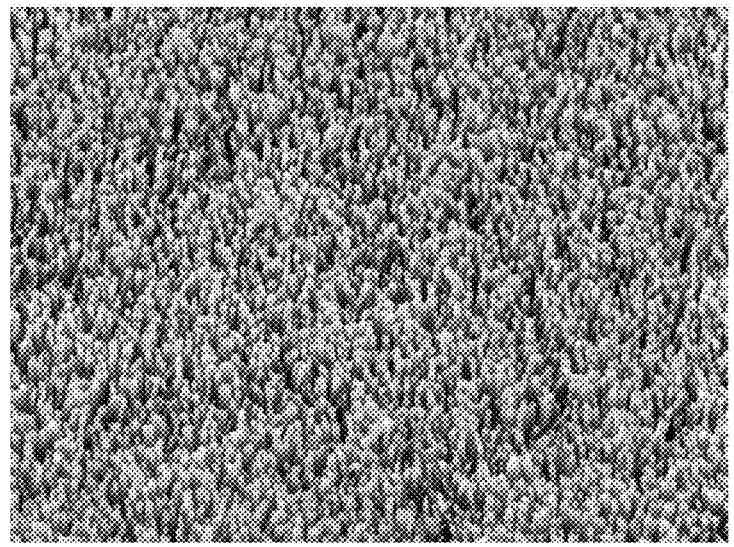
FIG. 5 is a scanning electron microscope ("SEM") image of a ZnO nanorod vertically grown with respect to a surface of graphene, according to Example 1.

FIG. 5 is a scanning electron microscope ("SEM") image of the ZnO nanorod that has grown vertically with respect to a surface of the graphene.

Figure 6A:
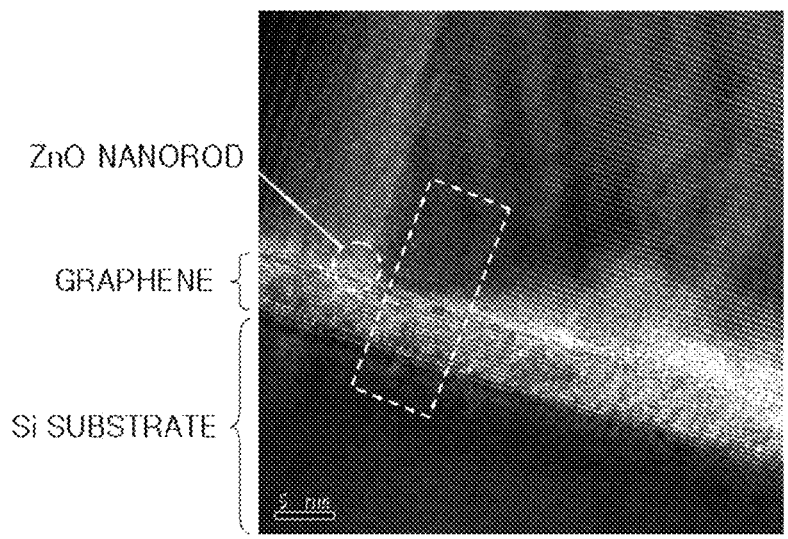
FIG. 6A is a transmission electron microscope ("TEM") image of an interface between a ZnO nanorod and graphene, according to Example 1.
Figure 6B:
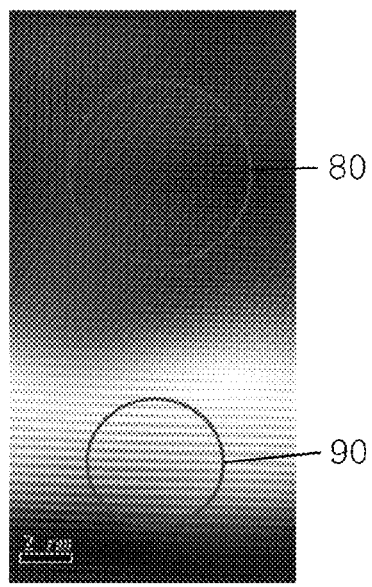
FIG. 6B is an enlarged view of the indicated portion of FIG. 6A.
Figure 6C:
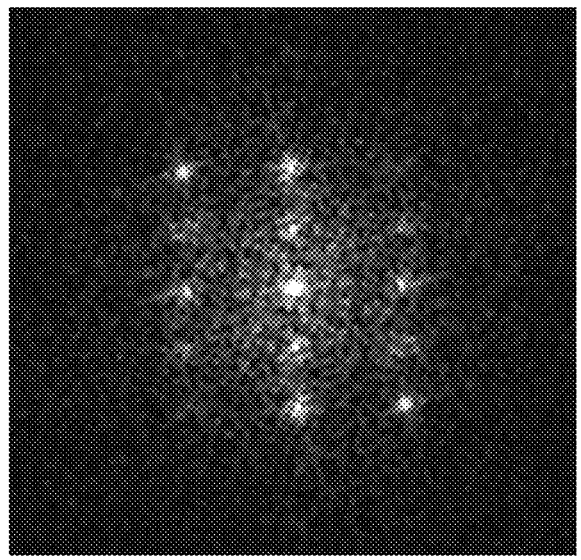
FIG. 6C is a selected area diffraction pattern of the upper indicated (i.e., ZnO) portion of FIG. 6B.
Figure 6D:
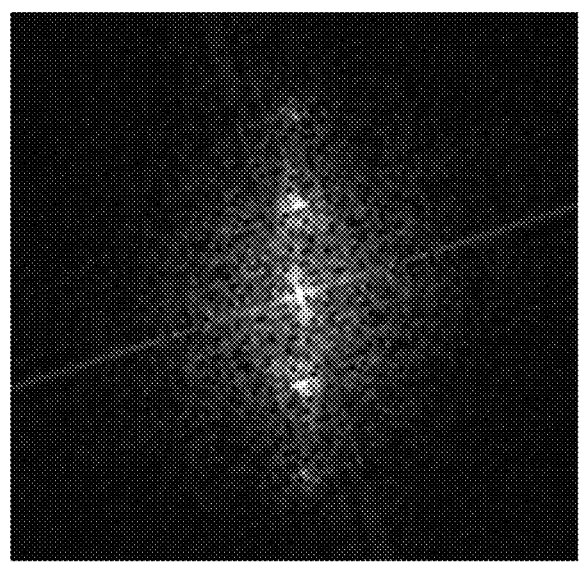
FIG. 6D is a selected area diffraction pattern of the lower indicated (i.e., graphene) portion of FIG. 6B.

FIG. 6A is a transmission electron microscope ("TEM") image of an interface between the prepared ZnO nanorod and the graphene according to Example 1. FIG. 6B is an enlarged view of the indicated portion of FIG. 6A, FIG. 6C is a selected area diffraction pattern of the upper indicated (i.e., ZnO) portion of FIG. 6B, and FIG. 6D is a selected area diffraction pattern of the lower indicated (i.e., graphene) portion of FIG. 6B. Referring to FIG. 6A, it can be seen that a (0001) plane of the ZnO nanorod is oriented parallel to a (0001) plane of the graphene at the interface between the ZnO and the graphene.

FIG. 6A shows that a crystal plane of the graphene and a crystal plane of the ZnO nanorod are sequentially stacked on a silicon (Si) substrate. FIG. 6B is an enlarged TEM image of the indicated portion of FIG. 6A showing the stack structure to clarify analysis of the interface between the graphene and the ZnO nanorod. The top circle 80 in FIG. 6B represents atomic crystal sites of the ZnO nanorod and the bottom circle 90 represents atomic crystal sites of the graphene. FIG. 6C and FIG. 6D show an electron diffraction pattern of the circled portions in FIG. 6B, in which FIG. 6C shows an electron diffraction pattern of the ZnO nanorod and FIG. 6D shows an electron diffraction pattern of the graphene. Referring to FIG. 6C, it can be seen that the atomic crystal sites of the ZnO nanorod are sequentially and regularly stacked.

Example 2

Figure 7A:
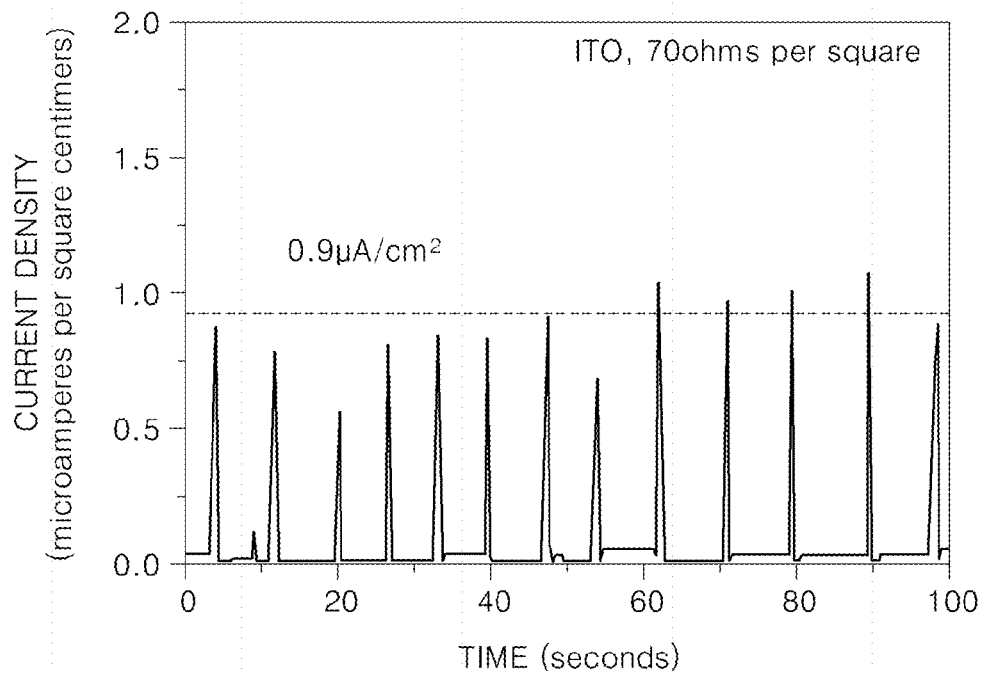
FIG. 7A is a graph of current density (microamperes per square centimeter, μA/cm$^2$) versus time (seconds) illustrating characteristics of a nanoscale power generator including an indium tin oxide ("ITO")-coated substrate manufactured according to Example 2.
Figure 7B:
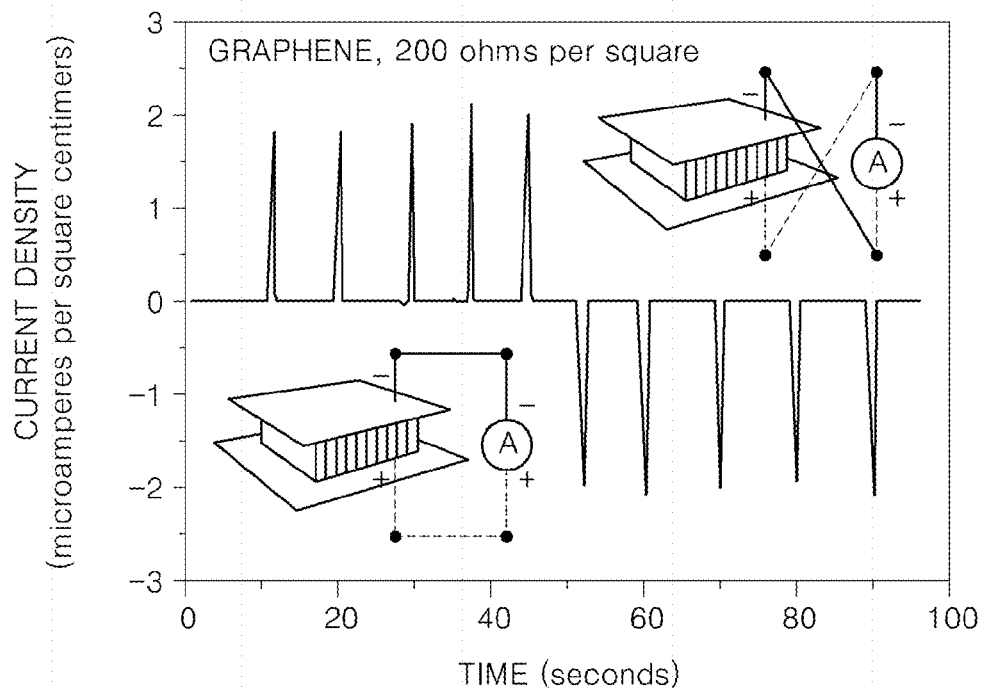
FIG. 7B is a graph of current density (microamperes per square centimeter, μA/cm$^2$) versus time (seconds) illustrating characteristics of a nanoscale power generator including graphene-coated substrate manufactured according to Example 2.

A ZnO nanorod was grown on a PET substrate coated with indium tin oxide ("ITO") in the same manner as in Example 1. The ITO layer had a thickness of about 100 nm. The grown ZnO nanorod had the same length and diameter as the ZnO nanorod grown on the graphene coated PET substrate of Example 1. The ITO-coated PET substrate had a sheet resistance of about 70 ohms per square (ohm/sq), and the graphene-coated PET substrate had a sheet resistance of about 200 ohm/sq. A nanoscale power generator (i.e., piezoelectric generator) was manufactured using the substrate in the following manner. A sample formed by growing a ZnO nanorod on the ITO-coated PET substrate was used as a bottom plate and the ITO-coated PET substrate was used as a top plate. The top and bottom plates were coupled to each other to manufacture the nanoscale power generator, and an electrode was connected to the ITO of each of the top and bottom plates, respectively, to measure a current flowing through the nanoscale power generator. A nanoscale power generator using graphene may also be manufactured in the same manner as disclosed above. For example, a sample formed by growing a ZnO nanorod on the graphene-coated PET substrate was used as a bottom plate and the graphene-coated PET substrate was used as a top plate. The obtained top and bottom plates were coupled to each other to manufacture a nanoscale power generator, and an electrode was connected to the graphene of each of the top and bottom plates, respectively, to measure a current flowing through the nanoscale power generator. FIG. 7A is a graph of current density (microamperes per square centimeter, $\mu A/cm^2$) versus time (seconds, sec) and shows results of analysis of the nanoscale power generator manufactured using the ITO-coated substrate. FIG. 7B is a graph of current density (microamperes per square centimeter, $\mu A/cm^2$) versus time (seconds, sec) and shows results of analysis of the nanoscale power generator manufactured using the graphene-coated substrate. When a force of 0.9 kilogram-force (kgf) was applied to each of the nanoscale power generators, the nanoscale power generator manufactured using the ITO-coated substrate generated a current of about 1 $\mu A/cm^2$, and the nanoscale power generator manufactured using the graphene-coated substrate generated a current of about 2 $\mu A/cm^2$. Thus, in an embodiment wherein graphene, which has a sheet resistance of 200 ohm/sq was used, the generated power was twice that when ITO, which has a sheet resistance of 70 ohm/sq, was used, despite the fact that the sheet resistance of the graphene was three times greater than that of the ITO. These results show that the parallel stacking of a (0001) plane of graphene and a (0001) plane of the ZnO nanorod provides a decrease in interfacial defects and more efficient movement of electric charge.

In addition, after the above described compressing of the nanoscale power generator manufactured using the graphene-coated substrate, the electrodes were reversed and the nanoscale power generator having the graphene-coated substrate was compressed an additional 5 times with a force of 0.9 kgf. The results of these additional compressions, which is also shown in FIG. 7B, show that the nanoscale power generator having a graphene-coated substrate generated a current of about −2 $\mu A/cm^2$. Because nanoscale power generator generated a current of about the same magnitude in both the forward and reverse directions, the nanoscale power generator has a forward field direction which is about the same as a reverse field direction.

As described above, according to the one or more of the above embodiments, in the material comprising graphene and an inorganic material, defects at the interface between the graphene and the inorganic material are minimized and thus an interfacial resistance is reduced and thus, electrical charge flows more efficiently. In addition, because the cost of graphene is relatively low, the material may be used in various electrical devices, such as a light emitting diode ("LED"), a solar cell, or a power generator, for example.

It should be understood that the exemplary embodiments described therein should be considered in a descriptive sense only and not for purposes of limitation. Descriptions of features or aspects within each embodiment should be considered as available for other similar features or aspects in other embodiments.

What is claimed is:

1. A material comprising:
a substrate;
graphene disposed on the substrate; and
an inorganic material having a crystal system and disposed on the graphene,
wherein at least one crystal plane of the inorganic material is oriented parallel to a (0001) plane of the graphene,
wherein the inorganic material is disposed directly on the graphene, and
wherein a difference between a distance between atoms at first and third sites in a hexagon atomic arrangement of the inorganic material and a distance between carbon atoms at first and fourth sites of a hexagonal repeating unit of the graphene is about −10 percent to about 20 percent of the distance between the carbon atoms at the first and fourth sites of the hexagonal repeating unit of the graphene,
wherein the inorganic material comprises ZnO.

2. The material of claim 1, wherein the crystal plane of the inorganic material has an atomic arrangement of a hexagon.

3. The material of claim 1, wherein the crystal system of the inorganic material is a hexagonal system.

4. The material of claim 2, wherein the difference between the distance between the atoms at the first and third sites in the hexagon atomic arrangement of the inorganic material and the distance between the carbon atoms at first and fourth sites of the hexagonal repeating unit of the graphene is about 10 percent to about 20 percent of the distance between the carbon atoms at the first and fourth sites of the hexagonal repeating unit of the graphene.

5. The material of claim 2, wherein a first axis between the first and third atoms of the hexagon atomic arrangement of the inorganic material and a second axis between the first and fourth atoms of the graphene are oriented in a substantially same direction.

6. The material of claim 1, wherein the inorganic material is an epitaxial layer on the graphene.

7. The material of claim 1, wherein the graphene has a sheet shape and an area of equal to or greater than 1 square millimeter.

8. An electrical device comprising the material of claim 1.

9. A material comprising:
a substrate having a surface;
an inorganic material having a crystal system, wherein at least one crystal plane of the inorganic material is oriented to be parallel to the surface of the substrate; and
graphene interposed between the surface of the substrate and the inorganic material,
wherein at least one crystal plane of the inorganic material is oriented parallel to the (0001) plane of the graphene,
wherein a difference between a distance between atoms at first and third sites in a hexagon atomic arrangement of the inorganic material and a distance between carbon atoms at first and fourth sites of a hexagonal repeating unit of the graphene is about −10 percent to about 20 percent of the distance between the carbon atoms at the first and fourth sites of the hexagonal repeating unit of the graphene,
wherein the inorganic material comprises ZnO.

10. The material of claim 9, wherein the crystal plane of the inorganic material has an atomic arrangement of a hexagon.

11. The material of claim 9, wherein the crystal system of the inorganic material is a hexagonal system.

12. The material of claim 10, wherein the difference between the distance between the atoms at the first and third sites in the hexagon atomic arrangement of the inorganic material and the distance between the carbon atoms at the first and fourth sites of a hexagonal repeating unit of the graphene is about 10 percent to about 20 percent of the distance between carbon atoms at first and fourth sites of the hexagonal repeating unit of the graphene.

13. The material of claim 10, wherein a first axis between the first and third atoms of the hexagon atomic arrangement of the inorganic material and a second axis between the first and fourth atoms of the graphene are oriented in a substantially same direction.

14. The material of claim 9, wherein the inorganic material is an epitaxial layer on the graphene.

* * * * *